(12) United States Patent
Shkolnik et al.

(10) Patent No.: US 8,862,260 B2
(45) Date of Patent: *Oct. 14, 2014

(54) PROCESS FOR THE PRODUCTION OF A THREE-DIMENSIONAL OBJECT WITH RESOLUTION IMPROVEMENT BY "PIXEL SHIFT"

(75) Inventors: Alexandr Shkolnik, Los Angeles, CA (US); Hendrik John, Hunxe (DE); Ali El-Siblani, Dearborn Heights, MI (US)

(73) Assignee: Envisiontec GmbH, Gladbeck (DE)

(*) Notice: Subject to any disclaimer, the term of this patent is extended or adjusted under 35 U.S.C. 154(b) by 808 days.

This patent is subject to a terminal disclaimer.

(21) Appl. No.: 13/089,455

(22) Filed: Apr. 19, 2011

(65) Prior Publication Data

US 2011/0196529 A1    Aug. 11, 2011

Related U.S. Application Data

(60) Continuation of application No. 12/847,556, filed on Jul. 30, 2010, now Pat. No. 7,962,238, which is a division of application No. 11/126,068, filed on May 9, 2005, now Pat. No. 7,790,093.

(60) Provisional application No. 60/569,893, filed on May 10, 2004.

(30) Foreign Application Priority Data

May 10, 2004 (DE) .................... 10 2004 022 961

(51) Int. Cl.
*G06F 19/00* (2011.01)
*G03F 7/20* (2006.01)
*B29C 67/00* (2006.01)

(52) U.S. Cl.
CPC .......... *G03F 7/2022* (2013.01); *B29C 67/0055* (2013.01); *B29C 67/007* (2013.01); *G03F 7/2057* (2013.01)

USPC .......................................... 700/119; 700/120

(58) Field of Classification Search
CPC . B29C 67/0055; B29C 67/007; G03F 7/2057; G03F 7/2022
USPC .................................. 700/120; 264/497, 401
See application file for complete search history.

(56) References Cited

U.S. PATENT DOCUMENTS 4,575,330 A    3/1986  Hull
4,837,379 A    6/1989  Weinberg
(Continued)

FOREIGN PATENT DOCUMENTS

DE    02008019   9/1970
DE    4105314    8/1991
(Continued)

OTHER PUBLICATIONS

IEEE Super Resolution article abstract vol. 20, issue 3, pp. 21-36, May 2003.

(Continued)

*Primary Examiner* — Michael D Masinick
(74) *Attorney, Agent, or Firm* — Hansen IP Law PLLC

(57) ABSTRACT

The invention relates to a process or device for the production of a three-dimensional object by layer-wise solidification of a material which is solidifiable under the application of electromagnetic irradiation by means of mask illumination, wherein the mask is produced using an image forming unit having a prescribed resolution, which is formed from a constant number of image forming elements (pixels) being discrete and being arranged in a spatially mutually fixed manner. For the improvement of the resolution along the outer and inner contours of the sectional areas of the object to be generated layer-wise in the sub-pixel range, a multiple illumination per layer is performed, which consists of a series of multiple images that are mutually shifted in the sub-pixel range in the image/construction plane, wherein a separate mask/bitmap is produced for each shifted image.

20 Claims, 7 Drawing Sheets

(56) References Cited

U.S. PATENT DOCUMENTS

| | | |
|---|---|---|
| 4,929,402 A | 5/1990 | Hull |
| 4,999,143 A | 3/1991 | Hull et al. |
| 5,093,130 A | 3/1992 | Fujii et al. |
| 5,137,662 A | 8/1992 | Hull et al. |
| 5,143,663 A | 9/1992 | Leyden et al. |
| 5,173,266 A | 12/1992 | Kenney |
| 5,174,931 A | 12/1992 | Almquist et al. |
| 5,236,637 A | 8/1993 | Hull |
| 5,247,180 A | 9/1993 | Mitcham et al. |
| 5,248,456 A | 9/1993 | Evans, Jr. et al. |
| 5,254,979 A | 10/1993 | Trevett et al. |
| 5,263,130 A | 11/1993 | Pomerantz et al. |
| 5,268,994 A | 12/1993 | Keskes |
| 5,298,208 A | 3/1994 | Sibley et al. |
| 5,306,446 A | 4/1994 | Howe |
| 5,345,391 A | 9/1994 | Hull et al. |
| 5,360,981 A | 11/1994 | Owen et al. |
| 5,391,072 A | 2/1995 | Lawton et al. |
| 5,437,820 A | 8/1995 | Brotz |
| 5,447,822 A | 9/1995 | Hull et al. |
| 5,454,069 A | 9/1995 | Knapp |
| 5,510,077 A | 4/1996 | Dinh et al. |
| 5,523,193 A | 6/1996 | Nelson |
| 5,529,473 A | 6/1996 | Lawton et al. |
| 5,545,367 A | 8/1996 | Bae et al. |
| 5,569,431 A | 10/1996 | Hull |
| 5,571,471 A | 11/1996 | Hull |
| 5,630,981 A | 5/1997 | Hull |
| 5,651,934 A | 7/1997 | Almquist et al. |
| 5,653,925 A | 8/1997 | Batchelder |
| 5,823,778 A | 10/1998 | Schmitt et al. |
| 5,858,746 A | 1/1999 | Hubbell et al. |
| 5,876,550 A | 3/1999 | Feygin et al. |
| 5,891,382 A | 4/1999 | Almquist et al. |
| 5,894,036 A | 4/1999 | Tylko |
| 5,897,825 A | 4/1999 | Fruth et al. |
| 5,902,537 A | 5/1999 | Almquist et al. |
| 5,943,235 A | 8/1999 | Earl et al. |
| 5,980,813 A | 11/1999 | Narang et al. |
| 6,013,099 A | 1/2000 | Dinh et al. |
| 6,027,324 A | 2/2000 | Hull |
| 6,029,096 A | 2/2000 | Maners et al. |
| 6,048,487 A | 4/2000 | Almquist et al. |
| 6,051,179 A | 4/2000 | Hagenau |
| 6,078,038 A | 6/2000 | Cooper |
| 6,124,858 A | 9/2000 | Ge et al. |
| 6,158,946 A | 12/2000 | Miyashita |
| 6,171,610 B1 | 1/2001 | Vacanti et al. |
| 6,180,050 B1 | 1/2001 | Arai et al. |
| 6,222,550 B1 | 4/2001 | Rosman et al. |
| 6,245,479 B1 * | 6/2001 | Etzel ............... 430/200 |
| 6,280,727 B1 | 8/2001 | Prior et al. |
| 6,334,865 B1 | 1/2002 | Redmond et al. |
| 6,352,710 B2 | 3/2002 | Sawhney et al. |
| 6,391,245 B1 | 5/2002 | Smith |
| 6,500,378 B1 | 12/2002 | Smith |
| 6,501,483 B1 | 12/2002 | Wong et al. |
| 6,508,971 B2 | 1/2003 | Leyden et al. |
| 6,547,552 B1 | 4/2003 | Fudim |
| 6,600,965 B1 | 7/2003 | Hull et al. |
| 6,630,009 B2 | 10/2003 | Moussa et al. |
| 6,764,636 B1 | 7/2004 | Allanic et al. |
| 6,833,231 B2 | 12/2004 | Moussa et al. |
| 6,833,234 B1 | 12/2004 | Bloomstein et al. |
| 6,942,830 B2 | 9/2005 | Mulhaupt et al. |
| 6,963,319 B2 | 11/2005 | Pate et al. |
| 6,974,656 B2 | 12/2005 | Hinczewski |
| 6,989,225 B2 | 1/2006 | Steinmann |
| 7,034,811 B2 | 4/2006 | Allen |
| 7,052,263 B2 | 5/2006 | John |
| 7,128,866 B1 | 10/2006 | Henningsen |
| 7,195,472 B2 | 3/2007 | John |
| 7,403,213 B1 | 7/2008 | Morgan et al. |
| 7,467,939 B2 | 12/2008 | Sperry et al. |
| 7,758,799 B2 * | 7/2010 | Hull et al. ............... 264/401 |
| 7,962,238 B2 | 6/2011 | Shkolnik et al. |
| 8,703,037 B2 * | 4/2014 | Hull et al. ............... 264/401 |
| 2001/0028495 A1 | 10/2001 | Quate et al. |
| 2001/0048183 A1 | 12/2001 | Fujita |
| 2002/0028854 A1 | 3/2002 | Allanic et al. |
| 2002/0153640 A1 | 10/2002 | John |
| 2002/0155189 A1 | 10/2002 | John |
| 2003/0074096 A1 | 4/2003 | Das et al. |
| 2003/0173714 A1 | 9/2003 | Ueno |
| 2003/0205849 A1 | 11/2003 | Farnworth |
| 2004/0008309 A1 | 1/2004 | Yamahara et al. |
| 2004/0027363 A1 | 2/2004 | Allen |
| 2004/0028293 A1 | 2/2004 | Allen et al. |
| 2004/0118309 A1 | 6/2004 | Fedor et al. |
| 2005/0023710 A1 | 2/2005 | Brodkin et al. |
| 2005/0208168 A1 | 9/2005 | Hickerson et al. |
| 2005/0248061 A1 | 11/2005 | Shkolnik et al. |
| 2005/0248062 A1 | 11/2005 | Shkolnik et al. |
| 2005/0259785 A1 | 11/2005 | Zhang |
| 2005/0288813 A1 | 12/2005 | Yang et al. |
| 2006/0078638 A1 | 4/2006 | Holmboe et al. |
| 2006/0192312 A1 | 8/2006 | Wahlstrom |
| 2006/0239588 A1 | 10/2006 | Hull et al. |
| 2006/0249884 A1 | 11/2006 | Partanen et al. |
| 2007/0074659 A1 | 4/2007 | Wahlstrom |
| 2007/0075458 A1 | 4/2007 | Wahlstrom et al. |
| 2007/0075459 A1 | 4/2007 | Reynolds et al. |
| 2007/0075460 A1 | 4/2007 | Wahlstrom et al. |
| 2007/0075461 A1 | 4/2007 | Hunter et al. |
| 2007/0077323 A1 | 4/2007 | Stonesmith et al. |
| 2007/0257055 A1 | 11/2007 | Scott et al. |
| 2007/0259066 A1 | 11/2007 | Sperry et al. |
| 2008/0038396 A1 | 2/2008 | John et al. |
| 2008/0054531 A1 | 3/2008 | Kerekes et al. |
| 2008/0169586 A1 | 7/2008 | Hull et al. |
| 2008/0169589 A1 | 7/2008 | Sperry et al. |
| 2008/0170112 A1 | 7/2008 | Hull et al. |
| 2008/0179786 A1 | 7/2008 | Sperry et al. |
| 2008/0179787 A1 | 7/2008 | Sperry et al. |
| 2008/0181977 A1 | 7/2008 | Sperry et al. |
| 2008/0206383 A1 | 8/2008 | Hull et al. |
| 2008/0217818 A1 | 9/2008 | Holmboe et al. |
| 2008/0226346 A1 | 9/2008 | Hull et al. |
| 2008/0231731 A1 | 9/2008 | Hull |
| 2008/0309665 A1 | 12/2008 | Gregory, II |

FOREIGN PATENT DOCUMENTS

| | | |
|---|---|---|
| DE | 4105314 A1 | 8/1991 |
| DE | 4102257 | 7/1992 |
| DE | 4125534 A1 | 2/1993 |
| DE | 9319405.6 | 5/1994 |
| DE | 4340108 | 9/1997 |
| DE | 19716240 A1 | 10/1998 |
| DE | 19727554 | 1/1999 |
| DE | 29911122 U1 | 11/1999 |
| DE | 19838797 | 3/2000 |
| DE | 19929199 A1 | 1/2001 |
| DE | 10003374 | 8/2001 |
| DE | 10018987 | 10/2001 |
| DE | 20106887 | 10/2001 |
| DE | 69909136 T2 | 5/2004 |
| DE | 10256672 A1 | 6/2004 |
| DE | 102004022961 A1 | 12/2005 |
| EP | 0250121 | 12/1987 |
| EP | 0426363 | 5/1991 |
| EP | 0435564 A2 | 7/1991 |
| EP | 0466422 A1 | 1/1992 |
| EP | 0484086 A1 | 5/1992 |
| EP | 0958912 A1 | 11/1999 |
| EP | 1250997 A1 | 10/2002 |
| EP | 1270185 | 1/2003 |
| EP | 1192041 B1 | 3/2003 |
| EP | 1156922 B1 | 6/2003 |
| EP | 1674243 A2 | 6/2006 |
| EP | 1674243 A2 | 6/2006 |
| EP | 1849587 | 10/2007 |
| EP | 1876012 A1 | 1/2008 |
| EP | 1880830 | 1/2008 |

(56) References Cited

FOREIGN PATENT DOCUMENTS

| | | |
|---|---|---|
| EP | 1894704 | 3/2008 |
| EP | 1950032 | 7/2008 |
| EP | 2011631 | 1/2009 |
| EP | 2266781 | 12/2010 |
| EP | 2011631 B1 | 4/2012 |
| FR | 2254194 | 7/1975 |
| FR | 2583334 | 12/1986 |
| FR | 2634686 | 2/1990 |
| FR | 2692053 | 12/1993 |
| JP | 04371829 | 12/1992 |
| JP | 08150662 | 6/1996 |
| JP | 08192469 | 7/1996 |
| JP | 2002210834 | 7/2002 |
| WO | 9511007 | 4/1995 |
| WO | 9515841 | 6/1995 |
| WO | 9600422 | 1/1996 |
| WO | 9804950 | 2/1998 |
| WO | 9963385 | 12/1999 |
| WO | 0021735 | 4/2000 |
| WO | 0100390 | 1/2001 |
| WO | 0112679 | 2/2001 |
| WO | 0172501 A1 | 10/2001 |
| WO | 0227408 A2 | 4/2002 |
| WO | 03059184 | 7/2003 |

OTHER PUBLICATIONS

37 CFR 1.99 Submission and declaration.
Htt://www.hp.com/hpinfo/newsroom/press/2004/040609a.html "HP technology doubles the resolution of digital projection displays" Jun. 9, 2004.
W. Allen, R. Ulichney "Wobulation: Doubling the Addressed Resolution," SID 05 Digest, 2005.
Wobulation, saved as PDF from the Internet; wikipedia definition, citing several resolution-relate patents.
Wohlers Report 2000. "Rapid Prototyping & Tooling State of the Industry Annual Worldwide Progress Report", T. Wohlers, Wohlers Association, Inc., Fort Collins, Colorado (2000).
Stark, G.B., et al., "Biological Matrices and Tissue Reconstruction," Springer Publications, Berlin (1998).
Sachs, E, et al., "Three Dimensional Printing: Rapid Tooling and Prototypes Directly from CAD Model," Journal of Engineering for Industry, 114:481-488 (1992).
Kuhtreiber, W., Ph.D., et al., "Cell Encapsulation Technology and Therapeutics," Birkhauser, Boston (1998).
Landers, R., and Mulhaupt, R., "Desktop Manufacturing of Complex Objects, Prototypes and Biomedical Scaffolds by means of Computer-Assisted Design Combined with Computer-Guided 3D Plotting of Polymers and Reactive Oligomers," Macromolecular Materials and Engineering, 282:17-22 (2000).
Okada, T., and Ikada, Y., "Tissue Reactions to Subcutaneously Implanted, Surface-Modified Silicones," Journal of Biomedical Materials Research, 27:1509-1518 (1993).
Relou, I.A., et al., "Effect of Culture Conditions on Endothelial Cell Growth and Responsiveness," Tissue & Cell, 30 (5):525-538 (1998).
Nikolaychik, V.V., et al., A New, Cryoprecipitate Based Coating for Improved Endothelial Cell Attachment and Growth on Medical Grade Artificial Surfaces:, ASAIO Journal, 40:M846-M852 (1994).
Burns, "Automated Fabrication Improving Productivity in Manufacturing," 1993 (ISBN 0-13-119462-3).
Opposition to EP 1,849,587 dated Apr. 8, 2010.
C. Sun, et al., "Projection Micro-Stereolithography Using Digital Micro-Mirror Dynamic Mask," Sensors and Actuators A121 (2005) 113-120.
S. Ventura, et al., "Freeform fabrication of Functional Silicon Nitride Components by Direct Photoshaping," Mat. Res. Sol. Symp. Proc., vol. 625 (2000).
K. Takahashi, "A New Application of DMD to Photolithography and Rapid Prototyping System," Institute of Electronics, Information, and Communication Engineers, 2001.
English Translation of Japanese Patent Application Publication No. 2002-210834, Publication Date Jul. 31, 2002.
Issue Notification USPA U.S. Appl. No. 12/847,556, U.S. Patent No. 7,962,238.
English Translation of DE19929199, Pollack et al.
*3D Systems, Inc.* v. *Envisiontec, Inc., et al.* Special Masters Report and Recommendation on the Parties' Summary Judgement Motions.
International Search Report (German Translation) for PCT/EP20051005003.
Opposition to EP 2 011 631, dated Apr. 12, 2012.
European Patent Office (EPO) Notice of Opposition, dated Feb. 25, 2013.
Huang, et al., "Computer Supported Force Analysis and Layer Imagine for Masked Rapid Prototyping System" Department of Mechanical Engineering, National Taiwan University of Science and technology, Taipei, Taiwan, 2001.
Huang, et al., "On-line force monitoring of platform ascending rapid prototyping system" Journal of Materials Processing Technology 159 (2005) 257-264.
English translation of JP 08150662 from: http://www19.ipdl.inpit.go.jp/PA1/result/main/woYeaMaDA408150662P1.htm Jul. 15, 2011.
English translation of DE10256672 from Lexis Nexis Total Patent.

* cited by examiner

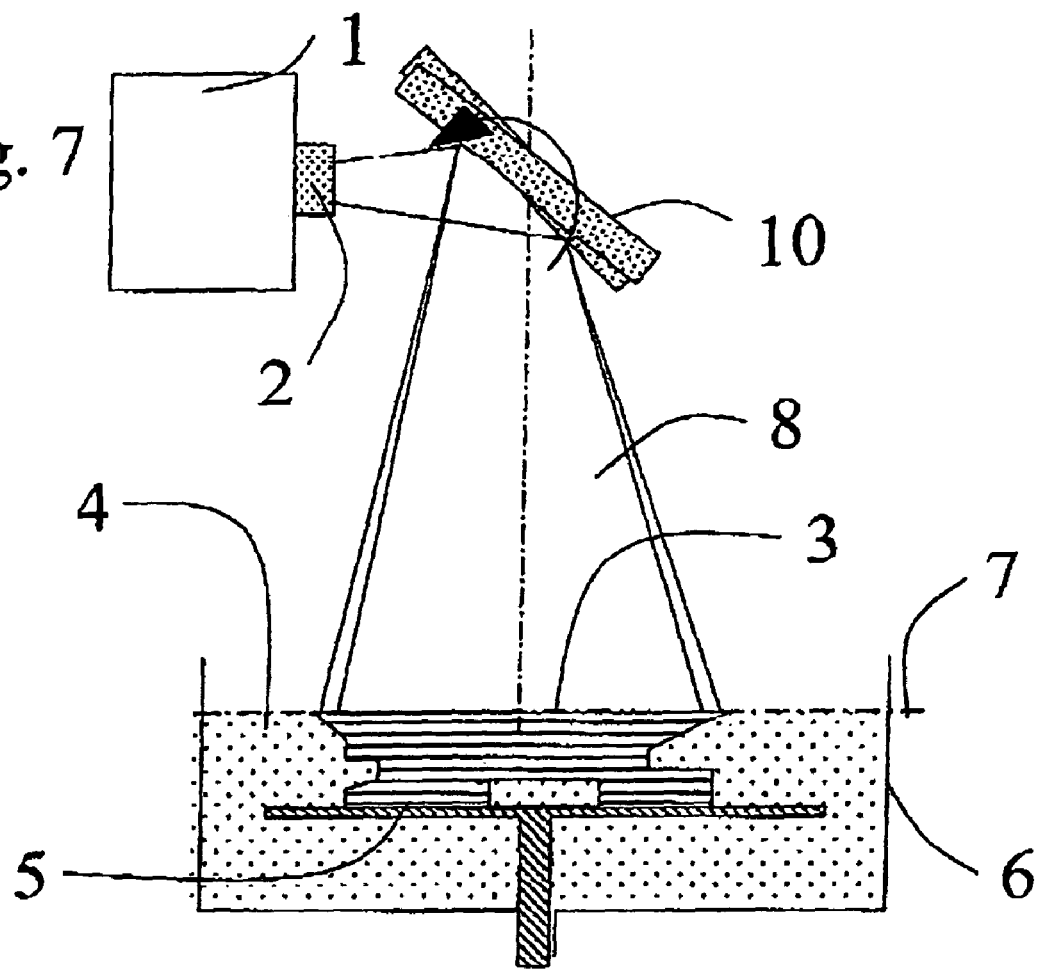

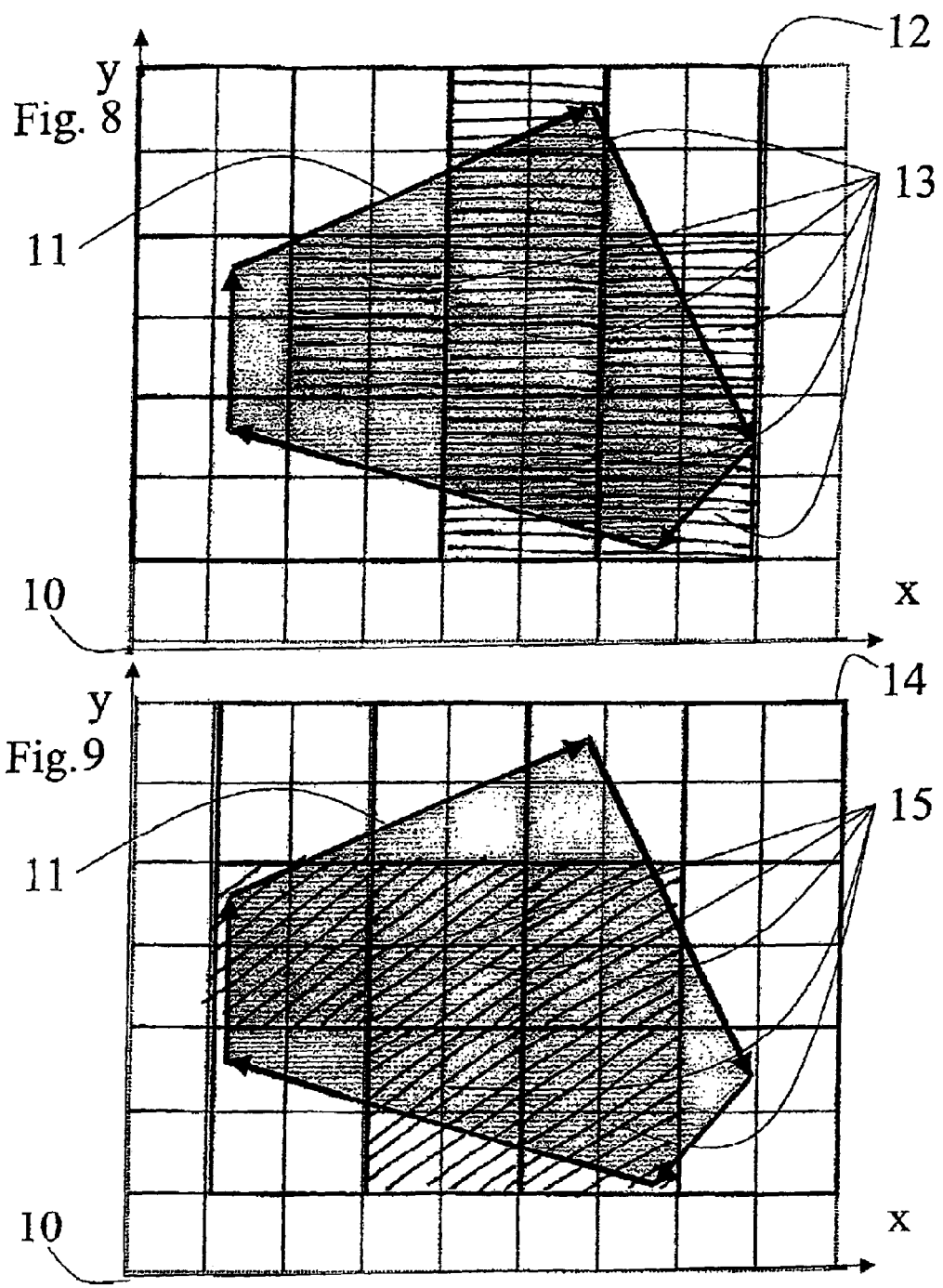

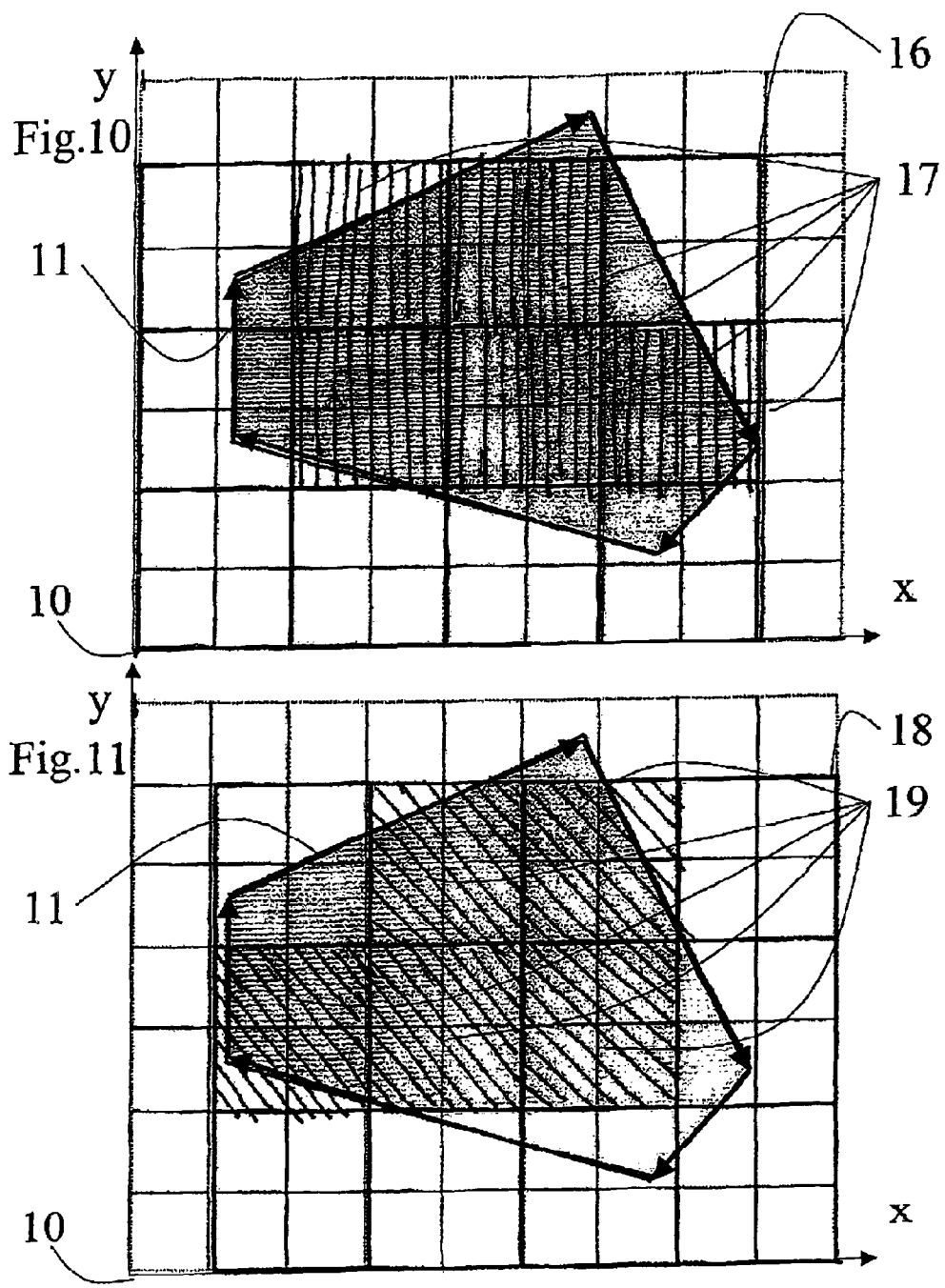

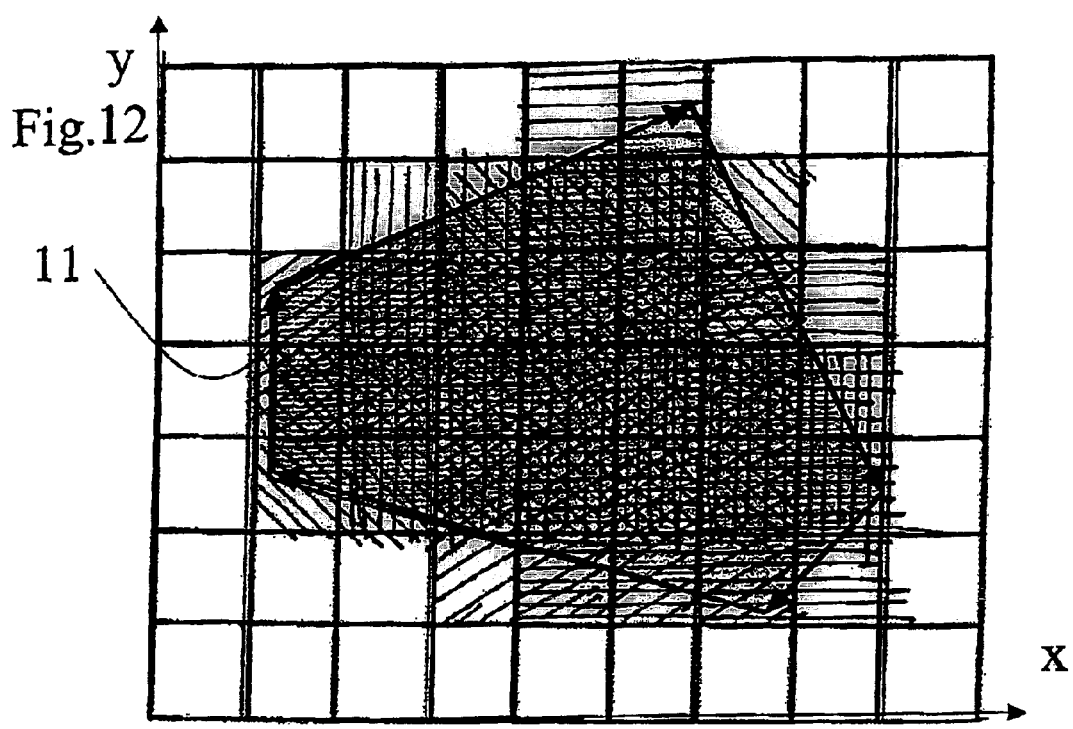

PROCESS FOR THE PRODUCTION OF A THREE-DIMENSIONAL OBJECT WITH RESOLUTION IMPROVEMENT BY "PIXEL SHIFT"

CROSS-REFERENCE TO RELATED APPLICATIONS

This application is a continuation of U.S. patent application Ser. No. 12/847,556, filed Jul. 30, 2010, now U.S. Pat. No. 7,962,238, which is a divisional of U.S. patent application Ser. No. 11/126,068, filed May 9, 2005, which issued as U.S. Pat. No. 7,790,093. U.S. Pat. No. 7,790,093 was reissued as U.S. Pat. No. RE 43,955 from U.S. patent application Ser. No. 13/230,270, which was filed on Sep. 12, 2011, and which claims the benefit of U.S. Provisional Patent Application No. 60/569,893, filed on May 10, 2004. The entirety of each of U.S. patent application Ser. Nos. 12/847,556 and 11/126,068 is hereby incorporated by reference.

TECHNICAL FIELD

The invention relates to a process and a device for the production of a three-dimensional object by layer-wise solidification of a photohardening material by mask illumination by means of a rastered image forming unit having constant resolution, wherein the resolution within the image/construction plane shall be improved in the sub-pixel range.

BACKGROUND ART

For the layer-wise construction of three-dimensional objects from "lighthardening" materials, various processes are mentioned in literature, see in this respect "Automated Fabrication-Improving Productivity in Manufacturing" of Marshall Burns, 1993 (ISBN 0-13-119462-3).

This invention relates to processes wherein the layer to be generated is based on illumination by means of a rastered mask, wherein the smallest physical resolution within the mask is provided by the size of a pixel.

Known possibilities presently are, inter alia, illumination by
 a) Projection unit (on the basis of DLP®/DMD®, LCD, ILA®, etc.)
 b) LD-display (reflective, transmissive)
 c) LED-, or laser-diode-line/-matrix (which is moved in XY-plane over the layer)
 d) Line or matrix (which is moved in XY-plane over the layer) based on MEM-technology (light-valve).

Some of these methods are described in the following patents:
 IPC: B29C67/00 "Rapid Prototyping apparatus and method of Rapid Prototyping" of Dicon AS (DK), (application)
 U.S. patent US005247180 A "Stereolithographic Apparatus and Method of use" of Texas Instruments Inc., September 1993.
 U.S. patent US00/5980813 A "Rapid Prototyping using multiple materials" of SRI International, November, 1999;
 Utility Model DE G 93 19 405.6 "Device for the production of a three-dimensional object (model) according to the principle of photosolidification" of Research Center Informatik at the University Karlsruhe, Dez. 1993;
 An application for the generation of micro-technical, three-dimensional construction parts according to a similar process is described in the Utility Model DE 299 11 122 U1 "Device for the production of a three-dimensional object" DeltaMed et al., June 1999.
 PCT Application 02 008 019.8 "Device for the production of a three-dimensional object" of Envision Technologies GmbH, April 2002.
 U.S. Pat. No. 6,180,050 describes a linear scan technique for layer-wise solidification in the production of three-dimensional objects. The resolution is enhanced by scanning, in X-direction, an illumination head having an array of optical fibers, which are displaced in the Y-direction.

Drawbacks of the Prior Art

With all of the above described processes, the resolution of the material layer to be hardened is in direct dependency from the resolution of an image forming process.

With the projection processes, an intermediary positioned optic additionally determines the scale of the projected or solidifiable layer.

The resolution per area unit in the image/construction plane thus is dependent on a) the resolution of the image forming unit or the smallest element, called pixel, and their relative mutual distances, called pixel-pitch, and b) the projection scale.

The surface roughness of the construction part thus is determined by the smallest volume unit of one voxel (volume-pixel), the size of which is composed of the projected pixel area in XY and the layer thickness in Z. The resolution of the layer thickness is prescribed by the smallest resolution (step level) of the actuator in Z, in order to move the support platform. Resolutions already down to the one-figure µm range is achievable hereby. If an even lower surface roughness of the construction part shall be realized, the projection field and concurrently the width of the pixel area must be down-sized.

As an example, the projection m.H. of a multi-media projector shall be mentioned here; with a resolution of XGA (1024×768 image dots), a pixel of 17 µm and pixel-pitch of 17.9 µm one realizes, at a projection to 275 mm×206 mm with an enhancement factor of the projection optic of 15, a resolution in the image/construction plane and thus in the layer to be solidified of approximately 100 dpi, which corresponds to a pixel size in the projection plane of about 0.254 mm×0.254 mm.

In order to e.g. double the resolution in the image-/construction plane, while maintaining the same construction area, it is proposed in the projection processes to half the projection/enhancement factor (which means to quarter the area) and, for the illumination of the four partial planes, to shift either the whole projection unit or the construction space mutually in parallel.

This process has the significant drawback that relatively high masses have to be moved towards each other very precisely in order to ensure an exact abutment and a close connection of the partial planes, which means a considerable expenditure of costs and additional need of space in the whole arrangement for the mechanics required therefore.

With the selective direct illumination by scanning m.H. of a LED- or laser-diode-line/-matrix or direct illumination by a mask, which is formed by a transmissive LCD, the resolution in the construction plane is equivalent to the resolution in the image forming unit.

Object of the Invention

It is an object of the invention to provide a process or a device which can enhance the resolution in the construction plane, while maintaining the same large construction area, many times in the sub-pixel range, i.e. to refine the rastering of the outer and inner contours in the sectional planes of the object,
  a) without having to carry out an illumination in partial areas to be composed together, and
  b) without enhancing the resolution of the rastered image-forming unit itself.

Solution of the Object

The present invention provides a process for the production of a three-dimensional object by layer-wise solidification of a material solidifiable by the action of electromagnetic irradiation by means of mask illumination, wherein the mask is produced by an image forming unit having a prescribed resolution, which mask is formed from a constant number of image forming elements (pixel) being discrete and spatially arranged in a fixed manner to each other, characterized in that, for improving the resolution in the sub-pixel range along the outer and inner contours of the sectional areas of the object to be generated layer-wise, a multiple illumination is carried out for each layer which consists of a sequence of a multitude of images mutually shifted in the sub-pixel range in the image/construction plane, wherein a separate mask/bitmap is produced for each shifted image.

The invention also provides a device for the production of a three-dimensional object by layer-wise solidification of a material which is solidifiable under the application of electromagnetic irradiation by means of mask illumination, whereby the irradiation necessary for hardening is imaged into the image/construction plane, wherein the device comprises a rastered, image forming unit for the selective illumination, which is embodied either by line or by matrix, characterized in that the image forming unit composes the image from individual image dots (pixels) and thus forms a rastered mask (bitmap), wherein the pixels are arranged within the plane in a manner mutually fixed to each other, and that the image forming unit and/or an imaging optic which is provided between the image forming unit and the image/construction plane is/are designed such that a sequence of a multitude of images, which are mutually shifted in a sub-pixel range, can be created, wherein a separate mask/bitmap can be produced for each shifted image.

Preferred embodiments of the process of the present invention include one or more of the following features:
  (a) said image forming unit is formed of a constant number of image forming elements (pixel) being discrete and spatially arranged to each other in a two-dimensional matrix;
  (b) a sequence of at least 2 images mutually shifted in the sub-pixel range is carried out in the image/construction plane, corresponding to the resolution of the image forming unit and under consideration of the corresponding sub-pixel shift;
  (c) the sectional area, i.e. outer and inner contours, are defined by vectorial trails which are superimposed by technical image processing by a rastered area (bitmap), the resolution of which exactly corresponds to the resolution of the discrete elements (pixels) in the image forming unit and thus in the image in the construction plane, wherein the superimposition of vectorial trails and bitmap takes place in a superior-ordered XY-coordinate system, and wherein the active pixels are calculated by a specific algorithm in order to define the sectional area in the form of a rastered mask;
  (d) the mask generation (bitmapping) of each sectional area of a three-dimensional object is carried out in the starting position and in various states displaced (shifted) in the sub-pixel range in XY, and that a total image having an enhanced resolution in the contour portion corresponding to the pixel shift is obtained by the superimposition of these bitmaps per sectional area;
  (e) a bitmap is produced which is shifted relative to the sectional area by delta X, which results in a new distribution of active pixels;
  (f) a bitmap is produced which is shifted by delta Y in the sub-pixel range relatively to the sectional area, which results in a new distribution of active pixels;
  (g) a bitmap is produced which is shifted along the pixel diagonal by delta X and delta Y relatively to the sectional area, which results in a new distribution of active pixels;
  (h) the total illumination of an individual layer results from the partial illuminations of the masks/bitmaps shifted in the sub-pixel range;
  (i) for each layer of the object, a multitude of masks or bitmaps having different sub-pixel shifts in XY can be generated and can be illuminated serially for each layer to be hardened;
  (j) a simplified process for resolution improvement is achieved in a manner that only the bitmap of the starting position and the bitmap of the diagonal-shift by a half pixel-diagonal are produced and are subsequently illuminated for each layer to be hardened;
  (k) for the shifted imaging of the rastered masks/bitmaps in the construction plane which are produced in a shifted manner in the sub-pixel range for the purpose of selectively hardening the material layer, the image forming unit is tilted for each shifted bitmap such that the desired shift of the image in the sub-pixel range image/construction plane is achieved;
  (l) for the shifted imaging of the rastered masks/bitmaps in the construction plane which are produced in a shifted manner in the sub-pixel range for the purpose of selectively hardening the material layer, the image forming unit for each shifted bitmap is shifted by the corresponding sub-pixel range in X and Y, that is parallel in plane to the image/construction plane;
  (m) for the shifted imaging of the rastered masks/bitmaps in the construction plane which are produced in a shifted manner in the sub-pixel range for the purpose of selectively hardening the material layer, the image forming projection unit is maintained fixed in its position, and the imaging optic of the projection unit is tilted for each shifted bitmap such that the desired shift of the image in the image/construction plane in the sub-pixel range is achieved;
  (n) for the shifted imaging of the rastered masks/bitmaps in the construction plane which are produced in a shifted manner in the sub-pixel range for the purpose of selectively hardening the material layer, the image forming projection unit is maintained fixed in its position, and the imaging optic of the projection unit is shifted for each shifted bitmap in XY such that the desired shift of the image in the image/construction plane in the sub-pixel range is achieved;
  (o) for the shifted imaging of the rastered masks/bitmaps in the construction plane which are produced in a shifted manner in the sub-pixel range for the purpose of selectively hardening the material layer, the projection unit is tilted for each bitmap via actuators such that the projected image in the construction plane is shifted in the corresponding sub-pixel range in X and Y;

(p) for the shifted imaging of the rastered masks/bitmaps in the construction plane which are produced in a shifted manner in the sub-pixel range for the purpose of selectively hardening the material layer, a cardanic mounted transparent, plane-parallel plate is arranged between the projection unit and the image/construction plane, which plate shifts, by rotation around two axis (XY) which are present in-plane parallel to the image/construction plane, the projection beam path and thus the image in the image/construction plane in the sub-pixel range in X and Y;

(q) for the shifted imaging of the rastered masks/bitmaps in the construction plane which are produced in a shifted manner in the sub-pixel range for the purpose of selectively hardening of the material layer, a transparent plane-parallel plate is arranged between the projection unit and the image/construction plane, which plate shifts, by rotation around an axis parallel to a pixel-diagonal, the projection beam path and thus the image in the image/construction plane in the sub-pixel range along the pixel diagonal which is orthogonal thereto;

(r) for the shifted imaging of the rastered masks/bitmaps in the construction plane which are produced in a shifted manner in the sub-pixel range for the purpose of selectively hardening of the material layer, the projection unit is maintained fixed in its position, and to projection beam is deflected via a mirror into the image/construction plane, wherein the deflecting mirror is provided with an adjustment possibility (cardanic support) by which the projection beam for each shifted bitmap can be deflected such that a shift of the image in the sub-pixel range is achieved in the image/construction plane; and (s) the projected light output for each pixel is varied by "grey scaling" within a projection mask, in order to selectively influence the hardening level in a layer thereby and thus to raise the light output of the contour-pixel relative to the light output of the area-pixel, in order to compensate the partial illumination due to partial superimposition of a contour-pixel by the sub-pixel shift of the individual bitmap in the contour portion.

Preferred embodiments of the device of the present invention include one or more of the following features:

(1) said image forming unit for the selective illumination is embodied by a matrix;

(2) a series of at least 2 images, which are mutually shifted in a sub-pixel range, can be created in the image/construction plane (3) said image forming unit is a projection unit;

(4) said image forming unit is a line, particularly a matrix having discretely emitting elements for image formation;

(5) the device is provided with actuators in order to shift the whole image forming unit per partial image in a plane-parallel manner towards the image/construction plane in XY in the sub-pixel range;

(6) the device is provided with actuators which can tilt the image forming unit per shift-generated bitmap such that the individual, shift-generated bitmaps in the image/construction plane are imaged in a manner shifted in the sub-pixel range;

(7) between the image forming unit and the image/construction plane, a mirror is arranged as an imaging optic and is cardanically mounted and is rotatable via actuators such that the beam path is deflected into the image plane and that the individual, shift-generated bitmaps in the image/construction plane can be imaged in a correspondingly shifted manner in the sub-pixel range;

(8) between the image forming unit and the image/construction plane, a transparent plate having mutual plane-parallel surfaces is arranged as an imaging optic and can be tilted by means of one or more actuators such that the beam path is shifted and that the individual, shift-generated bitmaps in the image/construction plane are imaged in a manner shifted in the sub-pixel range;

(9) the image forming projection unit is maintained fixed in its position and that the imaging optic can be shifted in XY in a sub-pixel range of the image forming unit via actuators such that the desired shift of the image in the image/construction plane in a sub-pixel range is achieved; and

(10) the image forming projection unit is maintained fixed in its position and that the imaging optic can be tilted via actuators such that the desired shift of the image in the image/construction plane in the sub-pixel range is achieved.

Description of the Invention and its Advantages

By means of the process of the invention or the device of the invention, the resolution in the image/construction plane is improved in the sub-pixel range by means of "pixel-shift".

In particular, the present invention deals with the layer-wise solidification for the production of three-dimensional objects or construction elements by means of solidification of material (specifically by means of photo-polymerization) through mask projection, but not with a conventional layer-wise solidification through (linear) scan technique. This can be carried out according to the invention very efficiently and advantageously by using a two-dimensionally set array as the image generating element, wherein raster and/or resolution is (are) preset, e.g. by means of a set micro mirror array.

Compared to the scan technique, which is called VAROS (Variable Refraction Optical System) by Canon and "Double-CCD" by Epson, the principle of reading and overlapping of images mutually shifted in the sub-pixel range is used in this invention for rastered image forming processes of rapid prototyping.

The resolution or the number of image dots of the rastered, image forming unit itself does not have to be increased in order to realize an improvement in the solution within the construction plane.

For the enhancement of the resolution, the illumination does not occur in correspondingly down-sized, adjacently disposed partial areas, whereby the construction/illumination period for the whole area would be increased by the number of partial areas; rather, the projection/illumination occurs over the whole construction area.

By the measure that an overlapping of images that are mutually shifted in the sub-pixel range takes place, the construction/illumination period of the whole area increases only insubstantially.

The level of resolution improvement within the construction plane can be chosen freely.

BRIEF DESCRIPTION OF THE DRAWINGS

The disclosure will now be described, by way of example, with reference to the accompanying drawings, in which:

FIG. 7 is a schematic view of a device for generating a three-dimensional object comprising an image forming unit and a tiltable deflecting mirror;

FIG. 8 is a depiction of a bitmap representation of a sectional area of a three-dimensional object with the bitmap in a first position relative to an X-Y coordinate system;

FIG. 9 is a depiction of the bitmap of FIG. 8 in a second position relative to the X-Y coordinate system;

FIG. 10 is a depiction of the bitmap of FIG. 8 in a third position relative to the X-Y coordinate system;

FIG. 11 is a depiction of the bitmap of FIG. 8 in a fourth position relative to the coordinate system; and FIG. 12 is a depiction of the bitmaps of FIGS. 8-11 superimposed on one another on the X-Y coordinate system.

DESCRIPTION OF THE DRAWINGS AND THE PREFERRED EMBODIMENTS OF THE INVENTION

The present invention will be explained in detail in the following by way of examples and not in a limiting manner by means of drawings.

Figure 1:
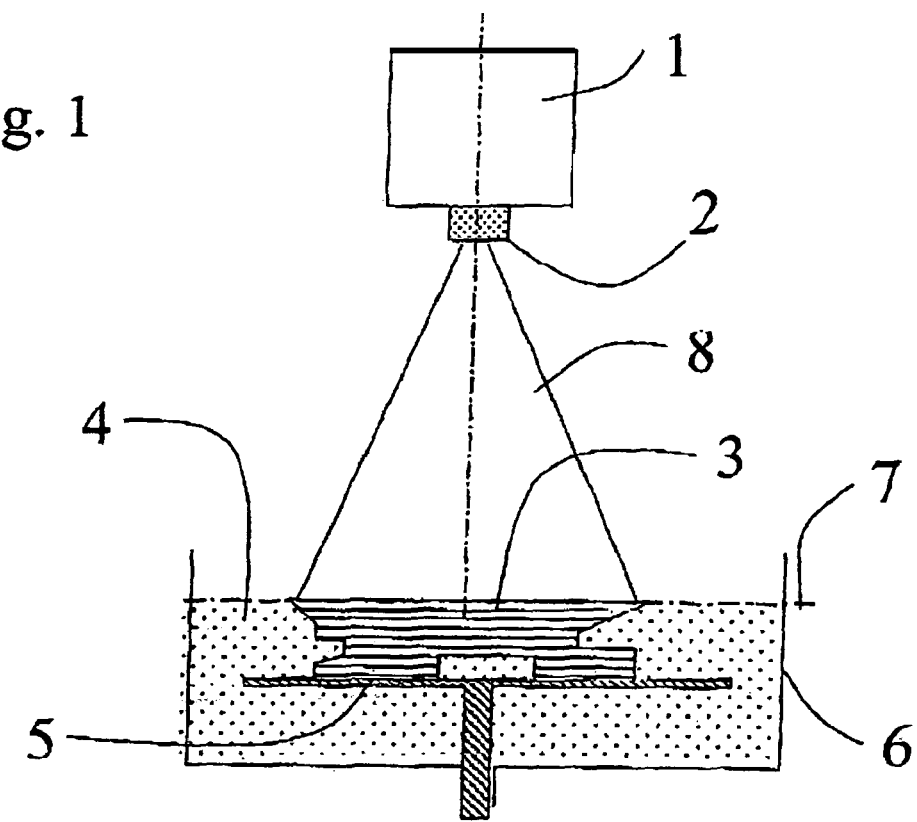
FIG. 1 is a schematic view of a device for generating a three-dimensional object by means of mask projection.

FIG. 1 schematically shows a basic device for the generation of a three-dimensional object 3 by layer-wise hardening of a photohardening material 4 by means of mask projection 8, wherein the projection unit 1 is present, with an image forming optic 2, above the basin 6 which is filled with photohardening material 4, and wherein the object 3 solidifies layer-wise on a support plate 5, which can be moved within the basin 6 in vertical direction. In a process based on photohardening by means of mask illumination, the irradiation necessary for hardening is projected into the image/construction plane 7. The illumination is carried out by means of a rastered image forming unit, which is formed in the form of a matrix. The image thus is composed of single image dots (pixels) and thus forms a rastered mask (bitmap), wherein the pixels are arranged in a specially fixed manner to each other within the plane.

By a simple example, FIGS. 8-12 show the principle of a mask generation (bitmapping) of a sectional area of a three-dimensional object in the starting position (FIG. 8) and in various states of the bitmap which are displaced (shifted) in the sub-pixel range (FIGS. 9-11), as well as the overlapping of all bitmaps (FIG. 12).

The sectional area, i.e. the outer and inner contours, are prescribed by a sectorial trail 11, which is superimposed by a rastered area (bitmap) 12, the solution of which exactly corresponds to the resolution of the discrete elements (pixels) within the projected image 8 which is formed by the image forming matrix. Vectorial trail 11 and bitmap 12 thus exist within a superior-ordered XY-coordinate system 10. FIG. 8 shows the bitmap in its starting position. By means of a specific algorithm, the active pixels 13 which describe the sectional area within the bitmap 12 in its starting position are calculated.

In FIG. 9, the bitmap 14 is shifted within the sub-pixel range relative to the sectional area by delta X, whereby a new distribution of active pixels 15 is produced.

FIG. 10 shows a shift of bitmap 16 relative to the sectional area by delta Y with active pixels 17.

FIG. 11 shows a diagonal shift of bitmap 18 relative to the sectional area by delta X and delta Y with active pixels 19.

In FIG. 12, all bitmaps 12, 14, 16 and 18 with their active pixels 13, 15, 17 and 19 are shown superimposed, whereby a resolution improvement in the (outer) contour portion of the sectional area is clearly noticeable.

A simplified process for resolution improvement is achieved by the measure that only bitmap 12 of the started position (FIG. 8) and bitmap 18 of the diagonal shift (FIG. 11) are superimposed. In this case, the bitmap or the image does only have to be shifted in one direction along the diagonal of the pixels.

Depending on the resolution improvement desired for each object layer, a multiple (at least twice) of masks or bitmaps having different sub-pixel shifts can be generated and superimposed.

Figure 2:
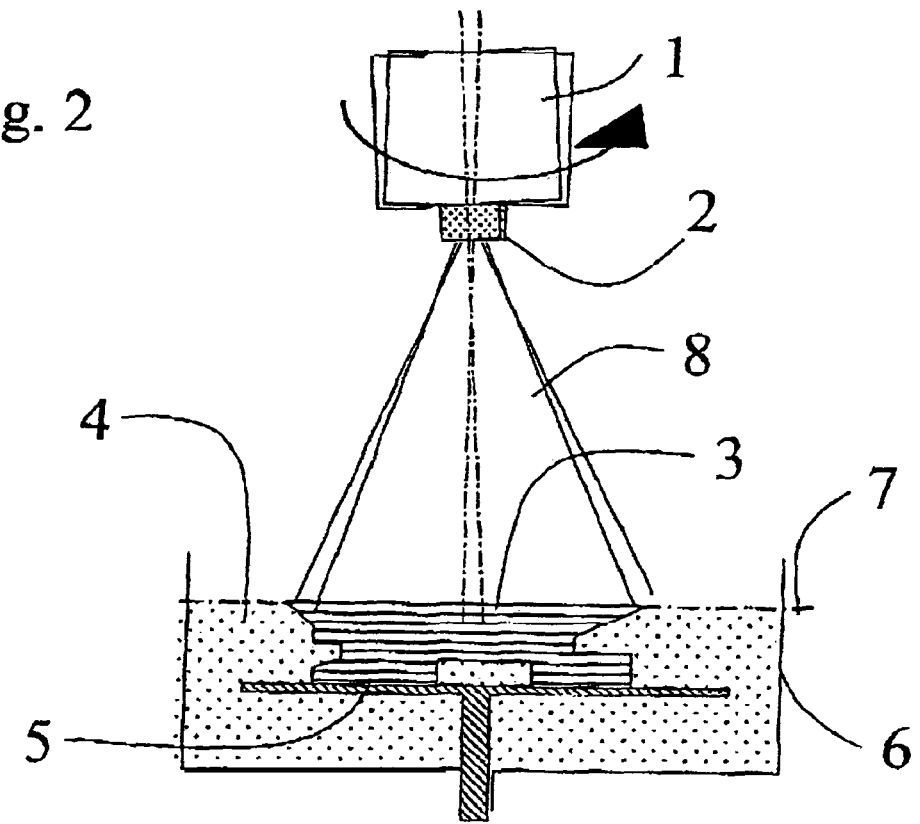
FIG. 2 is a schematic view of the device of FIG. 1 in which the image forming unit is tilted to shift a bitmap.
Figure 3:
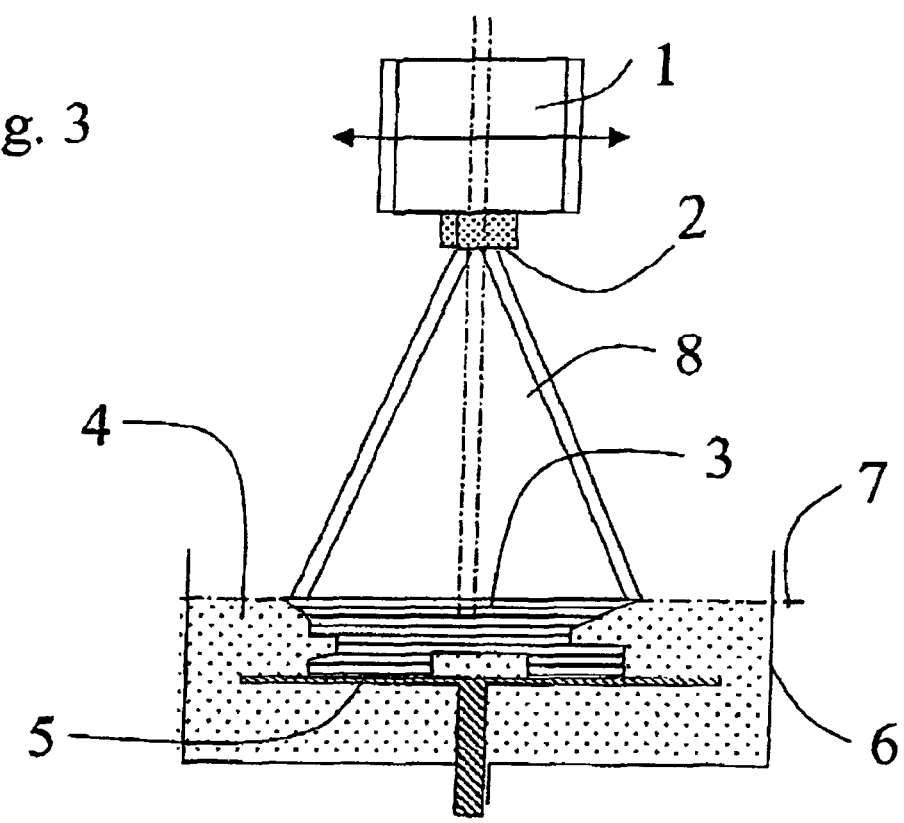
FIG. 3 is a schematic view of the device of FIG. 1 in which the image forming unit is shifted to shift a bitmap.
Figure 4:
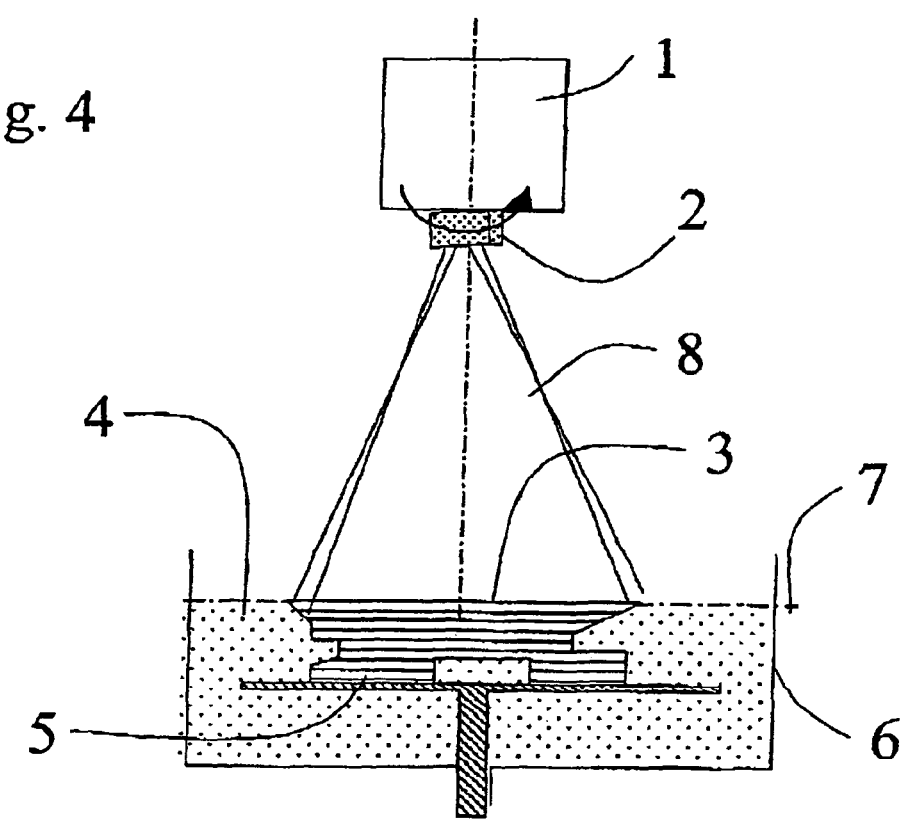
FIG. 4 is schematic view of the device of FIG. 1 in which the imaging optic is tilted to shift a bitmap.
Figure 5:
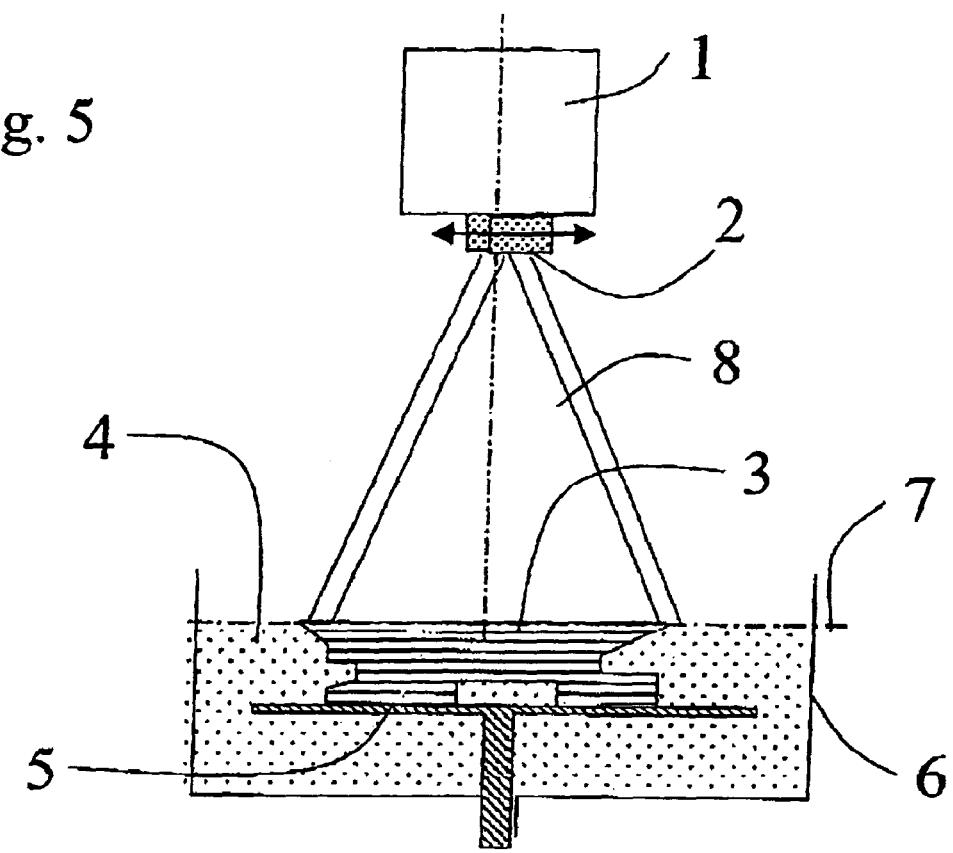
FIG. 5 is a schematic view of the device of FIG. 1 in which the imaging optic is shifted to shift a bitmap.
Figure 6:
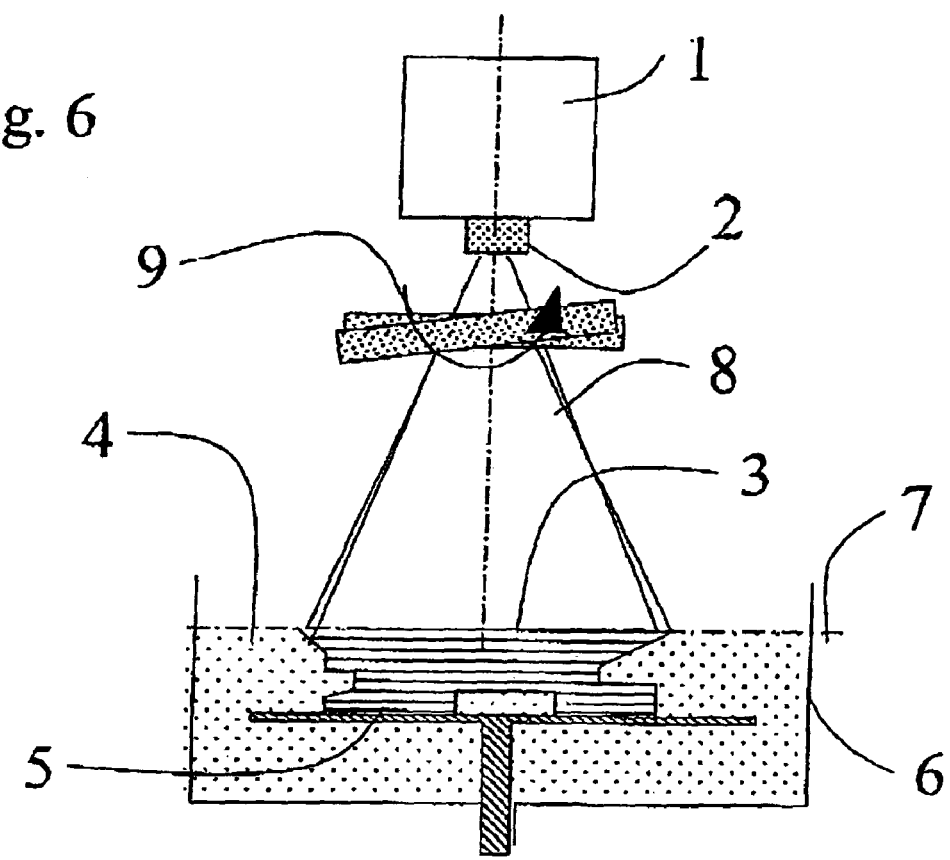
FIG. 6 is a schematic view of the device of FIG. 1 in which a cardanically-mounted, transparent, plane-parallel plate is disposed between the projection unit and the image/construction plane.

By means of a differently shifted and superimposed illumination of each object/material layer (here by means of bitmaps 12, 14, 16, 18), a resolution improvement in XY in the portion of outer and inner contours is achieved. In order to realize respective sub-pixel shifts in the image within the construction plane, the following various embodiments are described:

1) In FIG. 2, the image forming unit 1 is tilted for each shifted bitmap such that the desired shift of the image in the sub-pixel range within the image/construction plane is achieved.
2) In FIG. 3, the image forming unit 1 is shifted for each shifted bitmap by the corresponding sub-pixel level in X and Y, that is parallel in plane to the image/construction plane, by means of actuators.
3) In FIG. 4, the image forming projection unit is maintained fixed in its position. The imaging optic 2 is tilted for each shifted bitmap such that the desired shift of the image within the image/construction plane in the sub-pixel range is achieved.
4) In FIG. 5, the image forming projection unit is maintained fixed in its position. The imaging optic 2 is moved for each shifted bitmap in XY such that the desired shift of the image within the image-/construction plane in the sub-pixel range is achieved.
5) Particular cases for imaging by image-ward telecentric irradiation path, by an image-ward approximately telecentric irradiation path, and by teleobjectives having long focal length, in order to keep optical errors (angle errors, distortion) small:
   a) In FIG. 5, the projection unit 1 is tilted for each shifted bitmap via actuators such that the projection image 8 within the image/construction plane 7 is shifted in the corresponding sub-pixel range in X and Y.
   b) In FIG. 6, a cardanically mounted transparent, plane-parallel plate 9 (glass plate) is disposed between the protection unit 1 and the image/construction plane 7, which plate shifts the protection irradiation path 8 and thus the image within the image/construction plane 7 in the sub-pixel range in X and Y by means of rotation around two axis (XY), which are located parallel in plane to the image/construction plane.
   c) In FIG. 7, the projection unit 1 is maintained fixed in its position. The projection beam 8 is deflected via a mirror 10 into the image/construction plane 7. The deflecting mirror 10 is provided with an adjustment possibility (cardanic support), by which the protection beam can be deflected for each shifted bitmap such that a shift of the image within the image/construction plane 7 in the sub-pixel range is achieved.

The embodiments 1) to 5) or a) to c) described above can be realized individually or combined with each other.

The bitmaps of each individual layer necessary for mask projection are generated from layer data, in which the outer and inner contours of the respective object section is represented in vectorial trails (as e.g. defined in the data format CLI).

For this, a specific SW is used which carries out the transformation of the vectorial trails into the bitmap format (bit-mapping).

For each sub-pixel shift in XY, a separate bitmap is generated by transforming the XY coordinates of the vectors (for the outer and the inner contours) of the layer data by the respective shift-offset in XY (in the sub-pixel range), and by superposing them over the bitmap-raster, and thus by calculating a new distribution of active pixels for each shift.

The projected light output per pixel can be varied by "grey scaling" within a projection mask, in order to selectively influence the hardening level in one layer thereby. This is particularly meaningful in order to raise the light output of the pixels of the contour because only partial superimposition of the respective pixels of the contour are produced here due to the sub-pixel shift over individual bitmaps (in the areas within the contours a complete superimposition of the pixels of each individual bitmap is ensured).

When projecting/superimposing the section images shifted by sub-pixels, an almost homogeneous distribution of the light output or the illumination intensity can be achieved by means of the superimposition of grey scalings, particularly along the contours of the projected area structure, through the sum of the grey scaling masks.

What is claimed is:

1. A device for producing a three-dimensional object from a solidifiable material, comprising:
   an image forming unit comprising a number of image forming elements arranged in a two-dimensional matrix, wherein during an object building operation,
      each image forming element projects a first solidification energy onto a surface of the solidifiable material, thereby projecting a first set of pixels on the surface of the solidifiable material, the first set of pixels defining an image pattern at a first position and each pixel in the first set of pixels corresponding to one of the image forming elements, and
      each image forming element projects a second solidification energy onto the surface of the solidifiable material, thereby projecting a second set of pixels on the surface of the solidifiable material, the second set of pixels defining the image pattern at a second position shifted relative to the first position, and each pixel in the second set of pixels corresponding to one of the image forming elements.

2. The device of claim 1, wherein each image forming element corresponds to a location on the surface of the solidifiable material.

3. The device of claim 1, wherein the image pattern at the first position is defined by a bitmap having a plurality of grid elements, and each grid element corresponds to one of the image forming elements.

4. The device of claim 1, wherein the image pattern at the second position is shifted relative to the image pattern at the first position by an amount in the sub-pixel range.

5. The device of claim 1, wherein the surface of the solidifiable material defines an X-Y plane, and the image pattern at the second position is shifted relative to the image pattern at the first position in the X-Y plane.

6. The device of claim 1, wherein each pixel in the first set of pixels has a first gray scale value, each pixel in the second set of pixels has a second gray scale value, each pixel in the first set of pixels corresponds to the same location on the surface of the solidifiable material as a pixel in the second set of pixels, and at least some of the pixels in the first set of pixels have a first gray scale value that is different from the second gray scale value for the corresponding pixel in the second set of pixels.

7. The device of claim 1, wherein the shifted position between the image pattern defined by the first set of pixels and the image pattern defined by the second set of pixels is created by adjusting gray scale values for at least some of the pixels in the first set of pixels.

8. The device of claim 1, further comprising a basin containing the solidifiable material and an object support plate moveable within the basin.

9. The device of claim 1, wherein the image forming unit is a projection unit.

10. The device of claim 1, further comprising actuators configured to shift the image forming unit to create the shift between the image defined by the first set of pixels and the image defined by the second set of pixels.

11. The device of claim 1, further comprising actuators configured to tilt the image forming unit to create the shift between the image defined by the first set of pixels and the image defined by the second set of pixels.

12. The device of claim 1, further comprising a mirror imaging optic configured to rotate to create the shift between the image defined by the first set of pixels and the image defined by the second set of pixels.

13. The device of 1, further comprising a transparent plate imaging optic having mutual plane-parallel surfaces, wherein the plate is configured to tilt to create the shift between the image defined by the first set of pixels and the image defined by the second set of pixels.

14. The device according to claim 1, further comprising an imaging optic configured to be shifted to create the shift between the image defined by the first set of pixels and the image defined by the second set of pixels.

15. The device according to claim 1, further comprising an imaging optic configured to be tilted to create the shift between the image defined by the first set of pixels and the image defined by the second set of pixels.

16. A process for making a three-dimensional object from a solidifiable material, comprising:
    projecting a first set of pixels of solidification energy onto a surface of the solidifiable material, wherein the first set of pixels defines an image pattern;
    projecting a second set of pixels of solidification energy onto the surface of the solidifiable material, wherein the second set of pixels defines a shift of the image pattern.

17. The process of claim 16, wherein the surface of the solidifiable material defines an X-Y plane, and the shift of the image pattern is shifted in the X-Y plane.

18. The process of claim 16, wherein each pixel in the first set of pixels corresponds to a location on the surface of the solidifiable material, and each pixel in the second set of pixels corresponds to a location on the surface of the solidifiable material.

19. The process of claim 16, wherein each pixel in the first set of pixels has an associated gray scale value, each pixel in the second set of pixels has an associated gray scale value, and the process further comprises adjusting the gray scale values of at least some of the pixels in the first set of pixels to define the gray scale vales associated with the second set of pixels.

20. The process of claim 16, further comprising providing an image forming unit comprising a plurality of image forming elements, wherein each image forming element corresponds to one of the pixels in the first set of pixels and one of the pixels in the second set of pixels.

\* \* \* \* \*

UNITED STATES PATENT AND TRADEMARK OFFICE
CERTIFICATE OF CORRECTION

Page 1 of 1

PATENT NO.          : 8,862,260 B2
APPLICATION NO.     : 13/089455
DATED               : October 14, 2014
INVENTOR(S)         : Alexandr Shkolnik, Hendrik John and Ali El-Siblani It is certified that error appears in the above-identified patent and that said Letters Patent is hereby corrected as shown below:

In the Claims,

Column 10, line 35, between "of" and "1", insert --claim--

Column 11, line 2, between "scale" and "associated", delete "vales" and insert --values--

Signed and Sealed this
Thirteenth Day of January, 2015

Michelle K. Lee
*Deputy Director of the United States Patent and Trademark Office*